United States Patent [19]
Reeves et al.

[11] Patent Number: 6,020,743
[45] Date of Patent: Feb. 1, 2000

[54] METHOD AND APPARATUS FOR DETECTING FAILED BATTERIES

[75] Inventors: Larry D. Reeves, Palo Alto; Kan-Chiu Seto, Saratoga; Dung A. Tran, San Jose, all of Calif.

[73] Assignee: Compaq Computer Corporation, Cupertino, Calif.

[21] Appl. No.: 08/955,433

[22] Filed: Oct. 21, 1997

[51] Int. Cl.[7] .................................................. G01N 27/416
[52] U.S. Cl. ........................... 324/434; 324/433; 340/636
[58] Field of Search .................................... 324/426, 427, 324/433, 434; 320/116, 133, 134, 136, 148, 162, 164; 340/636

[56] References Cited

U.S. PATENT DOCUMENTS

| | | | |
|---|---|---|---|
| 4,316,185 | 2/1982 | Watrous et al. | 324/434 |
| 5,281,920 | 1/1994 | Wurst | 324/434 |

OTHER PUBLICATIONS

Article by: H. Schmidt & C. Siedle, "CHarge EQualizer: The Solution to an Old Battery Problem," *Power Quality Assurance*(Jul./Aug. 1993).

*Primary Examiner*—Diep N. Do
*Attorney, Agent, or Firm*—Fenwick & West LLP

[57] ABSTRACT

A technique for detecting failed batteries while the battery is attached to one or more electronic devices and is receiving a float charge is disclosed. The float voltage minimizes the normal voltage differences between battery cells. The technique employs a ratio comparative analysis of cell voltages of a battery provided across the terminals of the battery. Application of the ratio comparative analysis in assessing the condition of a battery assumes an equal voltage drop across each battery cell such that the cells are modeled as a series of resisters with respect to the float voltage. Such equal voltage drop enables a comparative ratio analysis of the voltage across each of the two portions of the battery's cell stack to the voltage across the entire battery. The comparative ratio analysis determines a voltage threshold that identifies whether a battery has a shorted or open cell.

28 Claims, 6 Drawing Sheets

BATTERY TESTING METHOD

SETTING THE THRESHOLD VALUE

DETERMINE THE VOLTAGE RATIO

METHOD AND APPARATUS FOR DETECTING FAILED BATTERIES

TECHNICAL FIELD OF THE INVENTION

This invention relates generally to a method and apparatus for detecting failed batteries, and more specifically, to a method and apparatus for determining whether a battery has shorted or open cells while the battery remains connected to other electrical devices and receives a float voltage.

BACKGROUND OF THE INVENTION

Detecting failed batteries has become particularly important in a number of key areas. One area, for instance, is to determine whether a battery has failed before a computer system attempts to rely upon it as a backup power supply following a failure of its primary power source.

There are several conventional methods used to measure the condition of rechargeable batteries, including: electrolyte specific gravity, gas-gauging, cell impedance measurements, and open circuit cell voltage. Some methods specifically apply to a given technology. For example, the electrolyte specific gravity methods apply to the specific gravity of the electrolyte applicable to wet cell batteries, where the electrolyte is accessible for testing. Gas-gauging methods apply only to applications where the battery is periodically discharged then recharged (e.g., a cyclic application). Other conventional methods, such as cell impedance methods, tend to require a significant amount of precision circuitry (and expense).

The open circuit method measures the condition of rechargeable batteries provided that the circuit voltage of an electrochemical system is at equilibrium. For a system to reach equilibrium, the battery, for twenty-four to one hundred and twenty hours, must neither receive a charge or current nor supply current to load. Accordingly, it is not practical to use the open circuit voltage method to measure the condition of batteries that power computer backup systems, since such batteries need to be continuously available. Therefore, it is unacceptable to use this method to test typical sealed lead-acid batteries used for computer backups and Uninterruptible Power Supply (UPS) applications.

Since batteries tend to lose charge while not in use, many battery backup power applications continuously provide just enough energy that slightly reverse biases the battery to overcome the battery's internal self-discharge losses and to maintain the battery's charge. Such reverse biasing is generally provided by placing a "float voltage" across the terminals of the battery.

Typical of conventional methods and apparatus that perform battery testing is the need to disconnect the battery from all connected electrical devices, especially lo the charging device before testing the battery. Further, because battery voltage tends to vary significantly when off-line, measuring off-line battery voltage generally does not conclusively establish whether the battery still has an acceptable charge. More particularly, Hawker Energy, a major manufacturer of typical sealed lead-acid batteries used in computer backup and UPS applications, indicates that the open is circuit voltage is an indicator of state of charge to an accuracy of ±20% for an off-line battery which has not been charged nor discharged for 24 hours. Hence, conventional testing methods that disconnect a battery for testing are unable to accurately determine battery voltage.

Still further, conventional testing system's need to disconnect a battery from all electrical devices is particularly troublesome if the battery serves as a backup power source, whether used for a telecommunications or computer system, a UPS, or an emergency lighting system that depends upon the battery functioning when needed to supply power. For instance, if a battery backup is not connected to a computer when the computer's primary power source fails, since there is neither a primary nor secondary backup power supply, such a computer system is likely to fail and cause fatal system errors. Such errors may corrupt data and software.

Since a computer may require a battery backup at a moment's notice, the battery should always be operational. Therefore, frequent battery tests are recommended to ensure that a battery is adequately charged when called upon to perform a power backup. However, because conventional battery testing systems generally need to have the battery disconnected from all electrical devices before testing the battery, frequent battery tests increase the likelihood that the battery backup will be unavailable when a primary power source fails. Without a charged battery backup, fatal system errors leading to lost and corrupted software and data could occur.

Conventional battery testing systems do not remedy the problems associated with testing a battery's charge while the battery is connected to a charging device. A reason for such failings is due to conventional systems' inability to distinguish between the voltage placed across the terminals of a battery by a battery charger and the battery's chemically induced voltage.

The purpose for placing a float voltage across the terminals of a battery is to prevent the natural degradation of the battery's charge, thereby prolonging the power and, thus, "life" of the battery. In order to charge a battery, the float voltage placed across the battery terminals must be greater than the voltage naturally generated by the battery's cells. Although helpful with prolonging the life of a battery, the float voltage tends to impede a conventional battery testing systems' ability to measure a battery's charge. Instead of measuring a battery's charge, conventional methods measure the greater of the two voltages, which is generally the float voltage, and are thus unable to determine when a battery fails. Consequently, conventional battery testing methods only determine whether the device providing the float voltage is working, but do not identify when a battery receiving the float voltage fails or is failing.

Also, typical of conventional battery testing systems is an inability to distinguish between the natural variability of voltage of each battery cell and a shorted-out battery cell. In a battery consisting of "n" cells in series, for example, a 48 volt battery consisting of 24 lead-acid cells, each with a potential of 2.0 volts, any one cell provides only 1/n of the total voltage. The battery terminal voltage under the range of charge and discharge conditions will typically vary from 40 to 56 volts in the above example (±16.7% of the nominal 48 V), while the voltage of one cell represents only slightly more than 4% of the battery voltage. Hence, the effect of one bad cell is difficult to distinguish from the normal variance of battery terminal voltage in the conditions of use. Because conventional battery testing methods are unable to distinguish between a battery having cells with a voltage charge less than nominal and a battery having a shorted-out cell, the testing method assumes the worst case, i.e., shorted cells, and therefore classifies the battery as "failed." Consequently, such a battery is prematurely discarded and replaced regardless of whether the battery is operational and meets acceptable voltage and current requirements pursuant to specifications.

Further, cell imbalances during charging and discharging are normal occurrences. Individual battery cell manufacturing variances will cause a series string of battery cells to have slightly different voltages at any given time in the charge or discharge cycle. In order to overcome differences between cell voltages, the float-charge maintains a small overcharge current in order to ensure that the weakest cells in the string receive sufficient charge. Typical conventional battery testing methods do not consider the minimizing effects to cell imbalances caused by a float voltage placed across the terminals of a battery.

As a result, there has been a need for a battery testing method and apparatus that measures battery voltage while on-line to determine whether the battery has failed due to either shorted or open cells, avoids the need to take the battery off-line, avoids the errors caused by measuring float voltage, distinguishes between shorted cells, open cells and less than nominal average cell voltages, does not require periodic discharge/recharge cycles and is inexpensive and does not include complicated test circuitry.

SUMMARY OF THE INVENTION

The present invention substantially improves on the prior art's method and apparatus for testing batteries to determine whether a battery has failed due to a shorted or open cell. The method and apparatus enables measurement of battery voltage while the battery remains connected to one or more electrical devices and receives a float voltage. For example, the present invention may test a battery while the battery backup power supply is connected to a computer and is receiving a float voltage. The float voltage provides slow rate battery recharging and in doing so minimizes voltage imbalances between cells. Further, there are normally small voltage differences between cells in a battery. These differences tend to be magnified during discharge and while capacity is returned to the cells during high rate recharging. Applying the float charge over a time period minimizes the normal voltage difference between cells, so that this method as applied distinguishes between normal cell voltage differences and cells that are open and shorted.

In particular, the method and apparatus of the present invention detects failed batteries by employing a ratio comparative analysis of voltage drops across the cells of a battery irrespective of the float voltage concurrently provided across the terminals of the battery. Application of ratio comparative analysis in assessing the condition of a battery assumes an equal voltage drop across each good battery cell. In this analysis, the cells of a battery are modeled as a series of resisters with respect to the float voltage placed across the terminals of the battery. Hence, it is possible to assume that each properly operating cell provides an equivalent voltage drop across each cell. Such equal voltage drops enable a comparative ratio analysis of the difference between the voltage drops across two half stacks of the battery's cells to the voltage across the entire battery.

The comparative ratio analysis determines the voltage threshold that categorizes a battery as either good or bad.

As described herein, the present invention is a battery testing system for identifying a failed battery, the system comprising: a battery having two portions connected in series, each portion including a plurality of serially connected cells; an electric circuit including the battery connected within the circuit; a battery charger connected to the battery and providing a float voltage across the plurality of serially connected cells; a voltage measuring device for measuring voltages across the battery, wherein the voltage measuring device separately measures voltages across the first portion, the second portion, and a combination of the two portions; and a battery tester determiner for receiving signals representing the measured voltages and determining whether a battery has failed based upon the voltage measured across the first portion, the voltage measured across the second portion, and the voltage measured across a combination of the two portions.

As further described herein, the present invention is a method of identifying a failed battery, wherein the battery includes two portions connected in series, each portion including a plurality of serially connected cells, the method comprising the steps of: receiving a first signal representing a voltage measured across the first portion while the battery receives a float voltage while connected to an electric charging circuit; receiving a second signal representing a voltage measured across the second portion while the battery receives the float voltage while connected to the electric charging circuit; receiving a third signal representing a voltage measured across a combination of the two portions while the battery receives the float voltage while connected to the electric charging circuit; determining whether a battery has failed based upon the voltage measured across the first portion, the voltage measured across the second portion, and the voltage measured across a combination of the two portions; and alerting an operator if the battery is bad.

It will be appreciated from the foregoing that a significant aspect of the present invention is the ability to determine the condition of the battery without disconnecting the battery from electrical charging devices. Further, the present invention determines the condition of the battery after minimizing the normal voltage differences between each of the battery's cells. Further, based upon a voltage ratio derived from measured voltages across a battery, the present invention is able to identify whether the cause of a battery failure is due to either a shorted or open cell.

More particularly, because the voltage across each serially connected portion of the battery is measured separately to calculate a voltage ratio, the testing method determines whether the battery has failed irrespective of the float voltage. This permits computer operators or automated computer programs to test a battery without disconnecting the battery from a device providing a battery charge. Thus, when the battery testing system of the present invention tests a computer system's battery backup supply, the battery may remain connected to the computer, accordingly providing a reliable power supply.

The invention may be better appreciated from the following Figures, taken together with the accompanying Detailed Description of the Invention.

BRIEF DESCRIPTION OF THE DRAWINGS

The invention will now be described with reference to the accompanying drawings, wherein.

DETAILED DESCRIPTION OF A PREFERRED EMBODIMENT

The following description is of the best presently contemplated mode of carrying out the invention. The description is made for the purpose of illustrating the general principles of the invention and is not to be taken in a limiting sense.

Figure 1A:
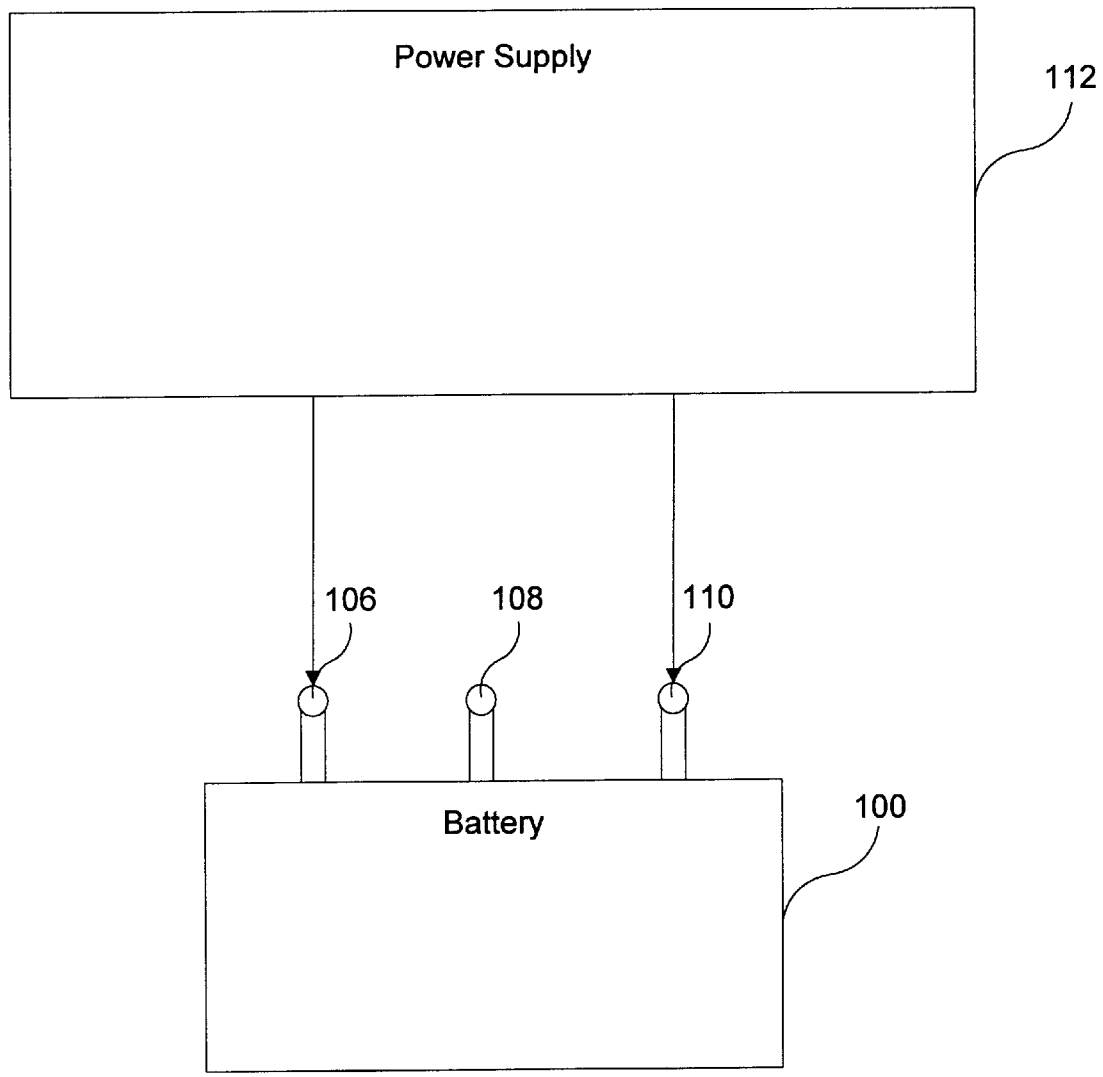
FIG. 1A shows a diagram of a battery receiving a float voltage of the present invention.

Referring first to FIG. 1A, a diagrammatic view of a battery receiving a float voltage of the present invention may be generally appreciated. As shown, the battery 100 is center-tapped, and includes one half of the cells between terminals 106 and 108, and the other half between terminal 108 and 110. A power supply (Vps) 112 provides a float voltage across each of the terminals, 106 and 110, to slightly reverse bias the battery 100 so as to maintain an appropriate charge.

Figure 1B:
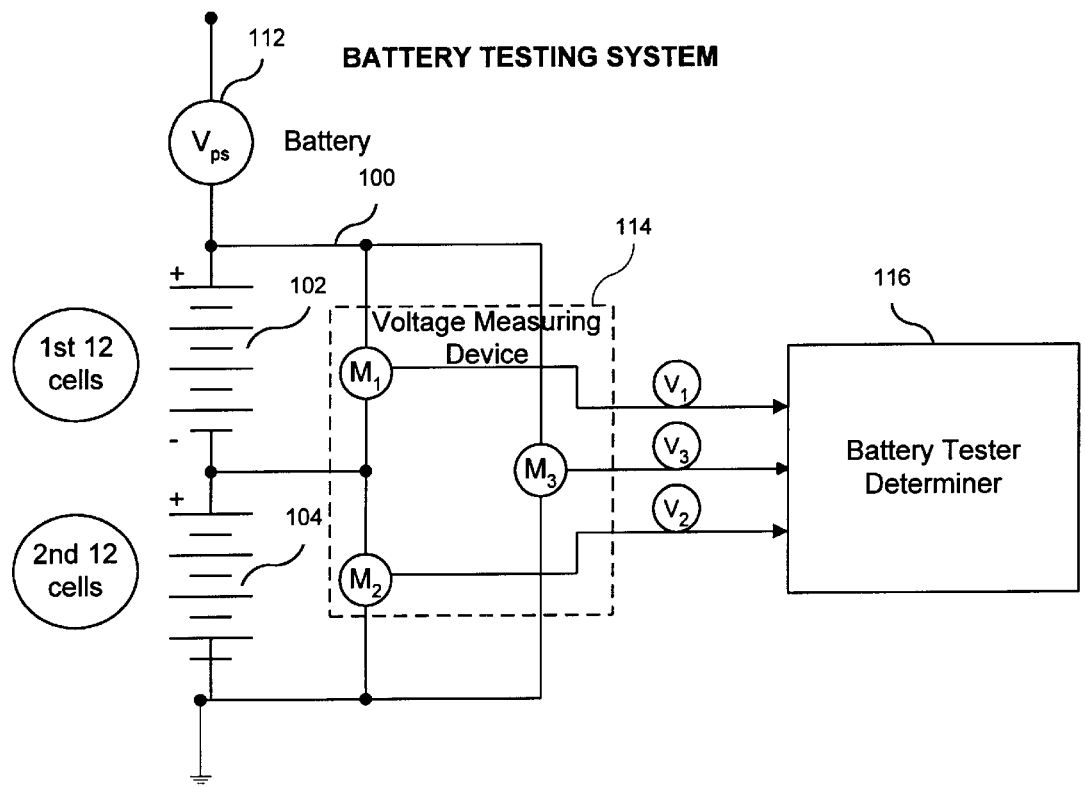
FIG. 1B shows a diagram of a preferred embodiment of the battery testing system of the present invention.

Referring next to FIG. 1B, a diagrammatic view of a battery testing system including the battery 100 and power supply of FIG. 1A may be generally appreciated. In particular, a preferred embodiment of a battery testing system including a battery 100, power supply 112, voltage measuring device 114 and battery testing determiner 116 is shown. In a preferred embodiment, the battery 100 is a lead/acid battery. However, alternative embodiments of the present invention may include other battery types. As shown, the lead/acid battery is a 24 cell center-tapped battery, including cells comprising a first ½ stack of 12 cells 102 and a second half stack of 12 cells 104.

The Vps 112 provides a float voltage across each cell of the first and second cell stacks (102 & 104) of the battery 100. In a preferred embodiment, each cell is identical and operates properly, so that the Vps voltage drop is divided evenly across the first and second ½ cell stacks (102 & 104) of the battery. In an exemplary but not limiting embodiment, the first ½ stack of cells 102 has a voltage "V1" of 25.8 volts, and the second ½ stack of cells 104 has a voltage, "V2" of 25.8 volts. Therefore, the combined voltage "V3" (or Vps) 110 is 51.16 volts. Having an equal voltage drop across each cell (2.15 volts), when a cell is good, and having an equal number of cells in each ½ stack of cells, enables the invention to detect shorted or open cells.

A voltage measuring device 114, comprising voltmeters $M_1$, $M_2$ and $M_3$, is electrically coupled to the battery 100. As shown, the voltage measuring device 114 coupled to the battery 100 measures a voltage across the first cell group 102, "V1," the voltage across the second cell group, "V2," and the voltage "V3" across all cells of the battery 100. Due to this time-dependent cell balancing which occurs during the float voltage, it is important that the battery test method allows sufficient time for cell imbalances to equalize before deciding that the battery pack is "failed." In a preferred embodiment, the decision as to whether the battery pack is "bad" is determined after a float voltage is applied to the battery after 24 hours. However, alternative embodiments before reading the voltages may apply a float voltage to minimize normal cell differences for more or less than 24 hours.

A battery tester determiner 116 receives and processes signals representing each of the voltage measurements, V1, V2 and V3 to determine whether the battery 100 has an open or shorted cell. In a preferred embodiment, the battery tester determiner 116 may include a software program running on a computer. Alternative embodiments of the invention may include a battery tester determiner 116 that is solely hardware, software, firmware, etc. In consideration of the various embodiments of the present invention provided herein, it is apparent that these examples are provided solely for illustrative purposes and should not be construed to limit the invention.

Figure 2:
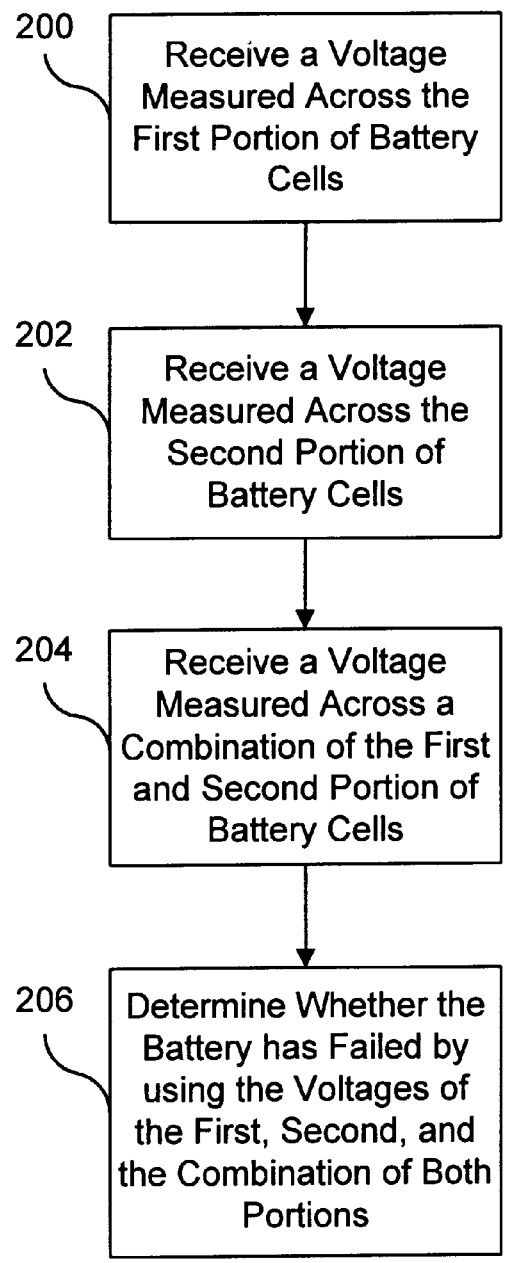
FIG. 2 shows a flowchart of the battery testing method as provided by the battery testing system of FIG. 1B.

Referring next to FIG. 2, the process of determining whether the battery 100 has an open or shorted cell in accordance with the present invention may be better appreciated. In step 200, the battery tester determiner 116 receives a voltage V1 measured across the first ½ stack of battery cells 102. In step 202, the battery tester determiner 116 receives a voltage V1 measured across the second ½ stack of battery cells 102. In step 204, the battery tester determiner 116 receives a voltage measured across a combination of the first and second ½ stacks of the battery cells. In step 206, the battery tester determiner performs a voltage analysis to determine whether the battery has failed due to a shorted or open cell by using the measured voltage data of V1, V1 and V3.

Figure 3:
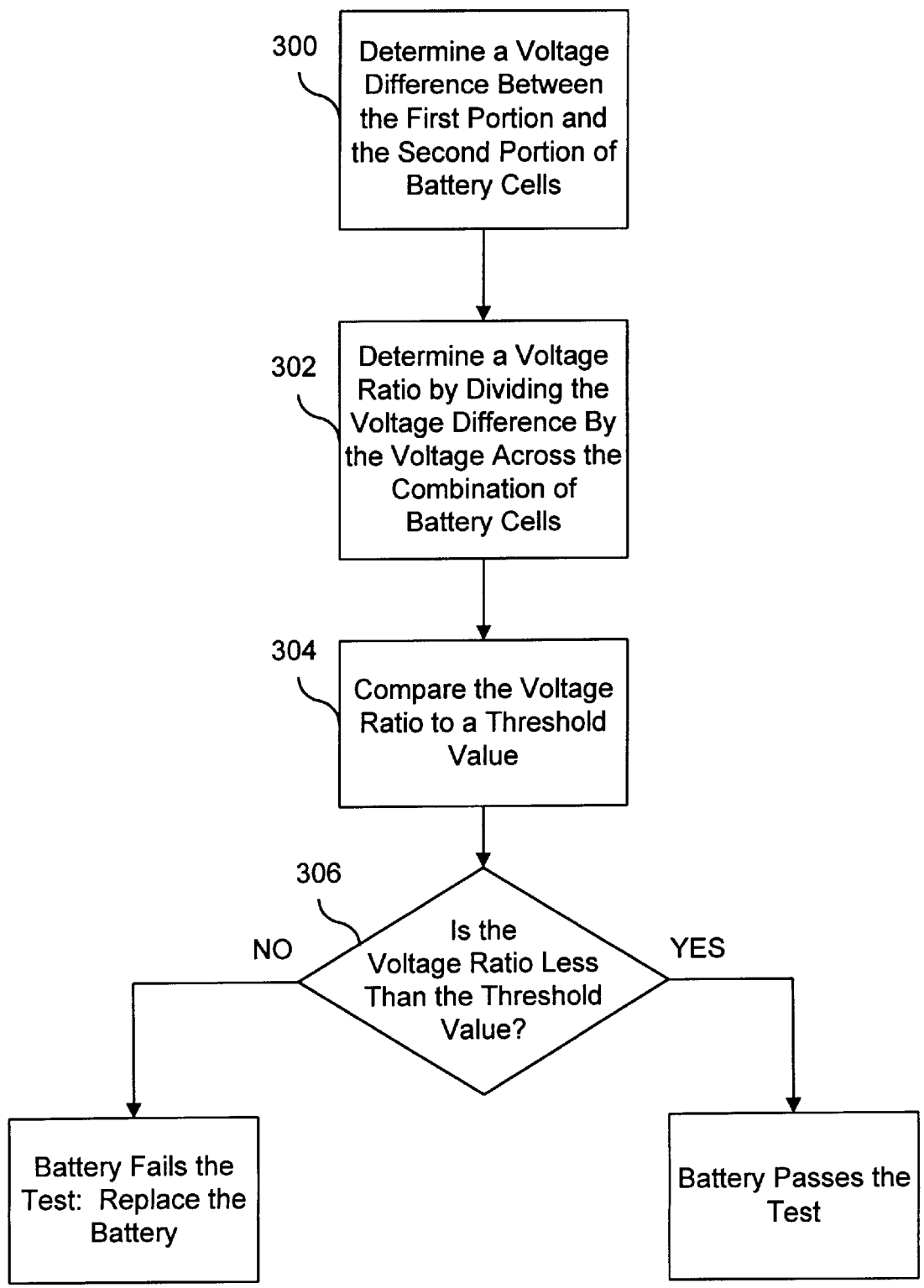
FIG. 3 shows a flowchart of voltage analysis of the battery testing method of FIG. 2 as performed by the battery tester determiner of FIG. 1B.

Referring next to FIG. 3, the voltage analysis performed by the battery tester determiner 116 to determine whether the battery 100 has an open or shorted cell may be understood in greater detail. In step 300, the battery tester determiner 116 determines the voltage difference between voltage V1 of the first portion of the battery 100 and voltage V1 of the second portion of the battery 100. After determining a voltage difference, in step 302, the battery tester determiner 116 determines a voltage ratio by dividing the voltage difference by the voltage across the combination of battery cells V3. In step 304, the battery tester determiner 116 compares the voltage ratio to a threshold value. The threshold value is a predetermined value set as the maximum percentage difference from nominal voltage that a battery with an adequate charge may possess. If, in step 306, the battery tester determiner 116 finds the voltage ratio less than the threshold value, the battery testing system passes the battery as possessing a satisfactory charge. In contrast, if the voltage ratio is greater than the threshold value then the battery testing system fails the battery as possessing an unsatisfactory charge. If the battery fails the test, it may be necessary to replace it with an alternative battery. In this case the computer may be programmed to so advise an operator based upon the output of the battery tester determiner. Further, based upon the voltage ratio, the operator will be able to identify whether the battery failure is due to either an open or shorted cell.

Figure 4:
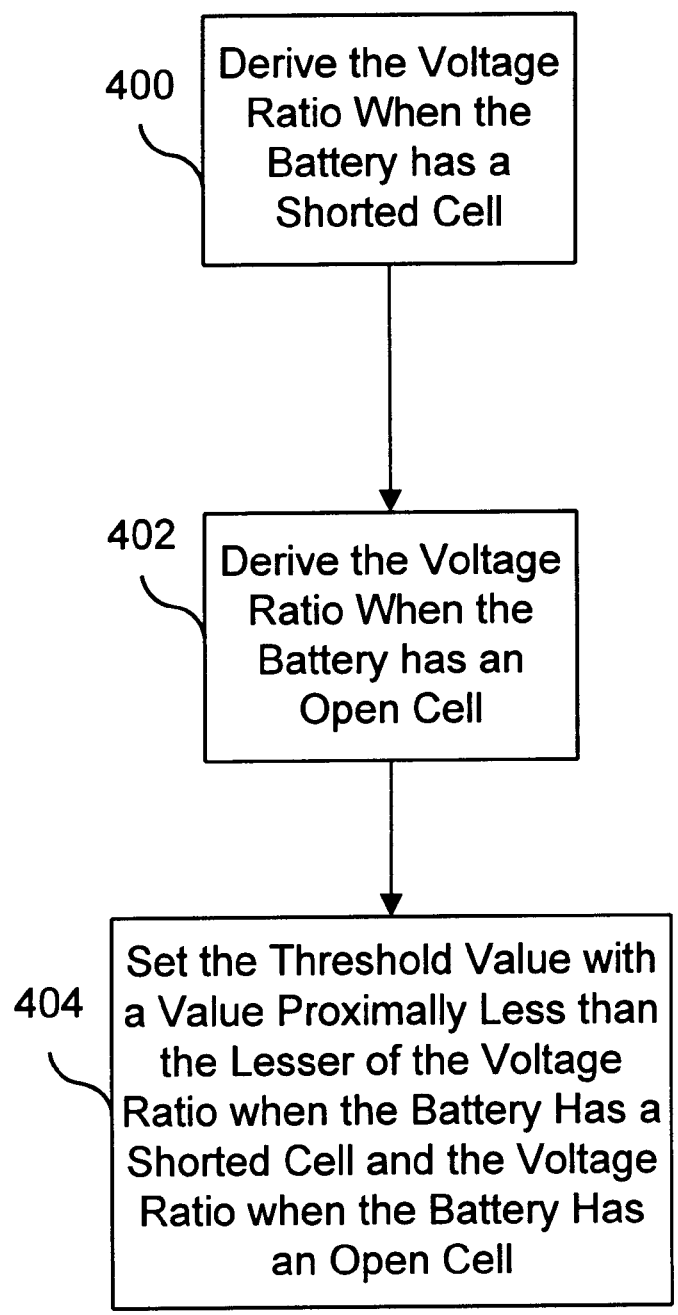
FIG. 4 shows a flowchart of the method of setting the threshold value that evaluates the condition of the battery of FIG. 1B.

Referring next to FIG. 4, the setting of a threshold value may be understood in greater detail. In step 400, a battery's voltage ratio is determined if one portion of the battery has a shorted cell. In step 402, a battery's voltage ratio is determined if one portion of the battery 100 has an open cell. After determining the theoretical voltage ratio of each test case, in step 404, the threshold value is set with a value proximally less then the lesser value of the voltage ratio when the battery 100 has a shorted cell and when the battery 100 has an open cell.

Figure 5:
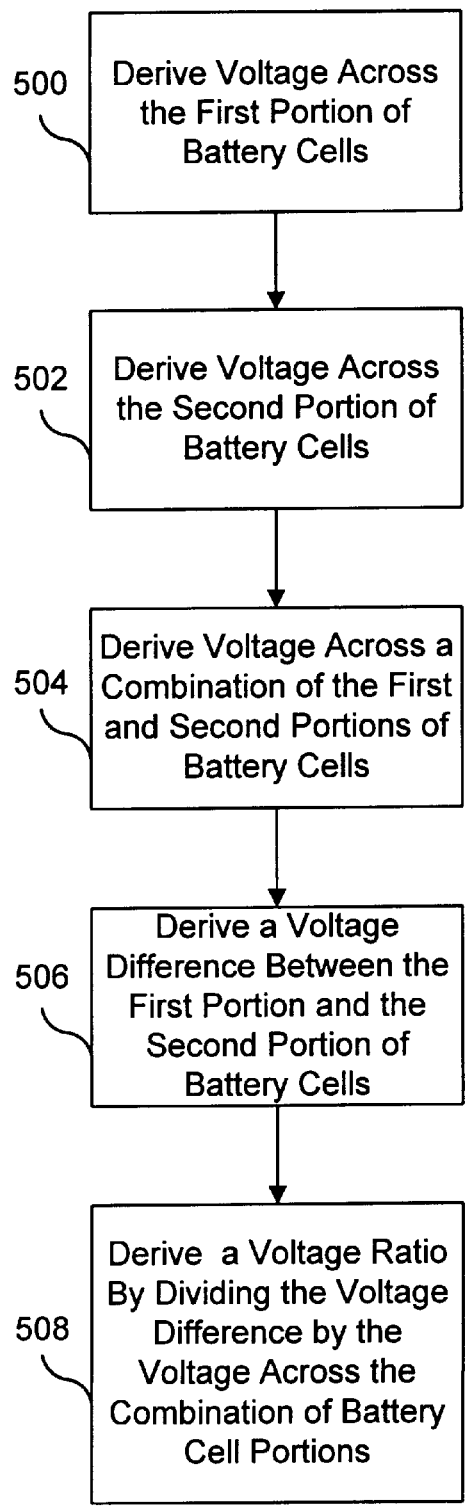
FIG. 5 shows a flowchart of the method of determining the voltage ratio to set the threshold value set in FIG. 4.

Referring next to FIG. 5, determining the voltage ratio when one portion of the battery has a shorted or an open cell may be understood in greater detail. More particularly, the following sequence of steps may be applied to determine the voltage ratio when either portion of cells of battery 100 has a shorted or an open cell. In step 500, the battery tester determiner 116 measures voltage V1 across the first portion of battery cells 102, and in step 502, measures the voltage V2 across the second portion of battery cells 104. In step 504, the battery tester determiner 116 measures the voltage V3 across a combination of the first and second portions of the battery cells. In step 508, the battery tester determiner 116 derives a voltage ratio by dividing the voltage difference V1–V2 by the voltage V3 across the combination of battery cell portions.

Tables 1 to 3 below show an example of FIGS. 4 and 5, where a battery having 24 cells are grouped into a first and second portion of 12 cells, where in table 1 all of the cells are good, in table 2 one cell of the first portion of cells is bad, and in table 3, one cell of the first portion of cells is open.

TABLE 1

All Good Cells

Battery = 24 cells = (1$^{st}$ Cell portion of 12 cells + 2$^{nd}$ Cell portion of 12 cells)
Voltage drop per Cell = 2.15 volts
1$^{st}$ Cell Portion = 12 good cells
2$^{nd}$ Cell Portion = 12 good cells
V3 = float voltage = 56.25 volts
Voltage Ratio Equation:   VR = (V1 − V2)/V3

$$= \frac{\left(\frac{56.25}{24} \times 12\right) - \left(\frac{56.25}{24} \times 12\right)}{56.25} = 0$$

= 28.125 − 28.125/56.25
VR = 0

TABLE 2

One Cell is Shorted

Battery = 24 cells = (1$^{st}$ Cell portion of 12 cells + 2$^{nd}$ Cell portion of 12 cells)
Voltage drop per Cell = 2.15 volts
1$^{st}$ Cell Portion = 12 good cells
2$^{nd}$ Cell Portion = 11 good cells & 1 shorted cell
V3 − float voltage = 56.25 V
Voltage Ratio Equation:   VR = (V1 − V2)/V3

$$= \frac{\left(\frac{56.25}{23} \times 12\right) - \left(\frac{56.25}{23} \times 11\right)}{56.25}$$

= (29.35 − 26.90)/56.25
= 4.35%

TABLE 3

One Cell is Open

Battery = 24 cells = (1$^{st}$ Cell portion of 12 cells + 2$^{nd}$ Cell portion of 12 cells)
1$^{st}$ Cell Portion = 12 good cells
2$^{nd}$ Cell Portion = 11 good cells & 1 open cell
VD per cell = 2.15 volts
V3 = Vps = F.V. = 56.25 V
Voltage Ratio Equation:
V1 = (12 * 2.15)
V2 = V3 − V1
   = Vps − (12 * 2.15)
V3 = Float voltage = 56.25 V
VR = (V1 − V2)/V3
   = (12 * VD) − (V3 − 12 * VD)/V3
   = (12VD − V3 + 12VD)/V3
   = (24VD − V3)/V3
VR = 24VD/V3 − 1
   = 24VD/V3 − V3/V3 = (24VD − V3)/V3
   = (2(12 * 2.15) − 56.25)/56.25
   = 8.26%

Once the theoretical voltage ratios for the cases where all cells of the battery are good, one cell of the battery is open, and one cell of the battery is shorted, a recommended threshold is set at a level proximally lower than the lower of the voltage ratio values of the case when the battery has a shorted cell, and the case when the battery has an open cell.

Hence, the voltage threshold ratio level may preferably be set to approximately 4 percent, a percentage proximally lower than the 4.35% voltage ratio derived for the battery having a shorted cell. The 4.0% value was chosen based upon the natural variability of battery voltage.

It can therefore be appreciated that a new and novel method and apparatus for determining whether a battery has shorted or open cells while the battery remains connected to an electrical charging device has been described. It will be appreciated by those skilled in the art that, given the teaching herein, numerous alternatives and equivalents will be seen to exist which incorporate the invention disclosed herein. For example, the present invention need not use lead acid battery; other types of batteries may be used. Battery need not be center tapped, but could have unequal numbers of cells on either side of tap. As a result, the invention is not to be limited by the foregoing exemplary embodiments, but only by the following claims and equivalents thereof.

We claim:

1. A method of identifying a failed battery, wherein the battery includes two portions connected in series, each portion including a plurality of serially connected cells, the method comprising the steps of:
   receiving a first signal representing a voltage measured across the first portion while the battery receives a float voltage while connected to an electric charging circuit;
   receiving a second signal representing a voltage measured across the second portion while the battery receives the float voltage while connected to the electric charging circuit;
   receiving a third signal representing a voltage measured across a combination of the two portions while the battery receives the float voltage while connected to the electric charging circuit;

determining whether the battery has failed based upon a ratio comparative analysis which is a function of the voltage measured across the first portion, the voltage measured across the second portion, and the voltage measured across a combination of the two portions.

2. The method as recited in claim 1, wherein the determining step includes the steps of:

determining a voltage difference between the voltage measured across the first portion and the voltage measured across the second portion;

determining a voltage ratio by dividing the voltage difference by the voltage measured across the combination; and comparing the voltage ratio to a threshold value, wherein if the voltage ratio is less than the threshold value then the battery passes and if the voltage ratio is greater than the threshold value then the battery fails.

3. The method as recited in claim 2 further including the step of determining the threshold value.

4. The method as recited in claim 3, wherein the step of determining the threshold value includes the steps of:

determining a first voltage ratio of a first battery having at least two portions connected in series with a shorted cell in either portion;

determining a second voltage ratio of a second battery having at least two portions connected in series with an open cell in either portion; and setting the threshold value to a value proximally less than the lesser of the first voltage ratio or the second voltage ratio.

5. The method as recited in claim 4, wherein the step of determining the first voltage ratio includes the steps of:

measuring a voltage across the first portion of the first battery;

measuring a voltage across the second portion of the first battery;

measuring a voltage across a combination of the two portions of the first battery;

determining a voltage difference between the voltage across the first portion and the voltage across the second portion; and determining the first voltage ratio by dividing the voltage difference by the voltage across the combination.

6. The method as recited in claim 4, wherein the step of determining the second voltage ratio includes the steps of:

measuring a voltage across the first portion of the second battery;

measuring a voltage across the second portion of the second battery;

measuring a voltage across a combination of the two portions of the second battery;

determining a voltage difference between the voltage across the first portion and the voltage across the second portion; and determining the second voltage ratio by dividing the voltage difference by the voltage across the combination.

7. The method as recited in claim 1, further comprising the step of alerting an operator if the battery is bad.

8. The method as recited in claim 1 further comprising the step of providing a float voltage for a time period across the plurality of serially connected cells of the battery, prior to receiving any signals, in order to minimize normal voltage differences between the cells.

9. The method as recited in claim 8 wherein the time period is 24 hours.

10. The method as recited in claim 7, wherein the step of alerting an operator if the battery is bad includes the further step of alerting the operator as to whether the battery is bad due to a shorted cell or an open cell.

11. A battery testing system for identifying a failed battery having at least two portions connected in series, the system comprising:

a battery charger which is removeably coupled to the battery for providing a float voltage across the battery;

a voltage measuring device for measuring voltages across the battery and providing a first signal, a second signal and a third signal, wherein the first signal represents a voltage measured across the first portion, the second signal represents a voltage measured across the second portion, and the third signal represents a voltage measured across a combination of the two portions; and a battery tester determiner coupled to the voltage measuring device for receiving the first signal, the second signal and the third signal; and determining whether the battery has failed based upon a ratio comparative analysis which is a function of the first signal, the second signal and the third signal.

12. The system as recited in claim 11 wherein the battery tester determiner determines whether the battery has failed by determining a voltage difference between the voltage measured across the first portion and the voltage measured across the second portion, calculating a voltage ratio by dividing the voltage difference by the voltage measured across the combination, and comparing the voltage ratio to a threshold value, wherein if the voltage ratio is less than the threshold value then the battery passes and if the voltage ratio is more than the threshold value then the battery fails.

13. The system as recited in claim 12, wherein the battery tester determiner sets the threshold value.

14. The system as recited in claim 13, wherein the threshold value is set by determining a first voltage ratio of a first battery having at least two serially connected portions with a shorted cell in either portion, determining a second voltage ratio of a second battery having at least two serially connected portions with an open cell in either portion, comparing the first voltage ratio with the second voltage ration and selecting a lesser value, and setting the threshold value to a value proximally less than the lesser value.

15. The system as recited in claim 14, wherein the battery tester determiner determines the first voltage ratio by measuring a voltage across the first portion of the first battery, measuring a voltage across the second portion of the first battery, measuring the voltage across a combination of the two portions of the first battery, determining a voltage difference between the voltage across the first portion and the voltage across the second portion, and dividing the voltage difference by the voltage across the combination.

16. The system as recited in claim 15, wherein the battery tester determiner determines the second voltage ratio by measuring a voltage across the first portion of the second battery, measuring a voltage across the second portion of the second battery, measuring a voltage across a combination of the two portions of the second battery, determining a voltage difference between the voltage across the first portion and the voltage across the second portion, and dividing the voltage difference by the voltage across the combination.

17. The system as recited in claim 11, wherein the battery tester determiner alerts an operator if the battery is bad.

18. The system as recited in claim 11 wherein the battery charger provides the float voltage across the plurality of serially connected cells for a time period, prior to the voltage measuring device measuring voltages across the battery, in order to minimize normal voltage differences between the cells.

19. The system as recited in claim 18 wherein the time period is 24 hours.

20. The system as recited in claim 17, wherein the battery tester identifies whether the battery is bad due to a shorted cell or an open cell.

21. A method for calculating a threshold value which is used to determine whether a battery having two serially connected portions is defective, the method comprising the steps of:

determining a voltage ratio for a first battery having two serially connected portions with a shorted cell in either portion;

determining a voltage ratio for a second battery having two serially connected portions with an open cell in either portion;

determining a lesser value between the voltage ratio for the first battery and the voltage ratio for the second battery; and setting the threshold value to a value proximally less than the lesser value.

22. The method as recited in claim 21, wherein the step of determining the voltage ratio of the first battery having a shorted cell includes the steps of:

measuring a voltage across the first portion of the first battery;

measuring a voltage across the second portion of the first battery;

measuring a voltage across a combination of the two portions of the first battery;

determining a voltage difference between the voltage across the first portion and the voltage across the second portion; and determining the voltage ratio by dividing the voltage difference by the voltage across the combination.

23. The method as recited in claim 21, wherein the step of determining the voltage ratio of the second battery includes the steps of:

measuring a voltage across the first portion of the second battery;

measuring a voltage across the second portion of the second battery;

measuring a voltage across a combination of the two portions of the second battery;

determining a voltage difference between the voltage across the first portion and the voltage across the second portion; and determining the voltage ratio by dividing the voltage difference by the voltage across the combination.

24. A computer program product which is readable by a machine, the product tangibly embodying a set of executable programming instructions which perform steps for detecting whether a battery having at least two portions is defective, the steps comprising:

receiving a first signal which represents a voltage measured across a first portion of the battery;

receiving a second signal which represents a voltage measured across a second portion of the battery;

receiving a third signal which represents a voltage measured across a combination of the first and second portions; and determining whether the battery is defective based upon a ratio comparative analysis which is a function of the voltage measured across the first portion, the voltage measured across the second portion, and the voltage measured across the combination of the first and second portions.

25. The computer program product of claim 24, wherein the ratio comparative analysis determines a voltage difference between the voltage across the first portion and the voltage across the second portion, calculates a voltage ratio by dividing the voltage difference by the voltage across the combination, and compares the voltage ratio to a threshold value, and further wherein if the voltage ratio is more than the threshold value then the battery is defective.

26. The computer program product of claim 25 wherein the threshold value is a predetermined value which is set by:

determining a first voltage ratio for a first battery having at least two serially connected portions with a shorted cell in either portion;

determining a second voltage ratio for a second battery having at least two serially connected portions with an open cell in either portion;

determining a lesser value between the first voltage ratio and the second voltage ratio; and setting the threshold value to a value proximally less than the lesser value.

27. The computer program product of claim 26, wherein the step of determining the first voltage ratio for the first battery includes the steps of:

receiving a voltage measured across the first portion of the first battery;

receiving a voltage measured across the second portion of the first battery;

receiving a voltage measured across a combination of the two portions of the first battery;

calculating a voltage difference between the voltage across the first portion and the voltage across the second portion; and determining the voltage ratio by dividing the voltage difference by the voltage across the combination.

28. The computer program product of claim 26, wherein the step of determining the second voltage ratio for the second battery includes the steps of:

receiving a voltage measured across the first portion of the second battery;

receiving a voltage measured across the second portion of the second battery;

receiving a voltage measured across a combination of the two portions of the second battery;

calculating a voltage difference between the voltage across the first portion and the voltage across the second portion; and determining the voltage ratio by dividing the voltage difference by the voltage across the combination.

* * * * *